United States Patent
Slater, Jr.

(10) Patent No.: US 7,638,811 B2
(45) Date of Patent: Dec. 29, 2009

(54) GRADED DIELECTRIC LAYER

(75) Inventor: David B. Slater, Jr., Durham, NC (US)

(73) Assignee: Cree, Inc., Durham, NC (US)

(*) Notice: Subject to any disclaimer, the term of this patent is extended or adjusted under 35 U.S.C. 154(b) by 42 days.

(21) Appl. No.: 11/685,761

(22) Filed: Mar. 13, 2007

(65) Prior Publication Data

US 2008/0224157 A1    Sep. 18, 2008

(51) Int. Cl.
*H01L 33/00* (2006.01)

(52) U.S. Cl. .................. 257/98; 257/79; 257/100; 257/E33.067

(58) Field of Classification Search .......... 257/79, 257/98, 100, E33.067
See application file for complete search history.

(56) References Cited

U.S. PATENT DOCUMENTS

| | | | |
|---|---|---|---|
| 4,152,044 A | 5/1979 | Liu | |
| 4,890,150 A | 12/1989 | Vera et al. | |
| 5,536,974 A * | 7/1996 | Nishiguchi | 257/778 |
| 5,880,510 A | 3/1999 | Cockrum et al. | |
| 6,051,876 A | 4/2000 | Gardner et al. | |
| 6,171,978 B1 * | 1/2001 | Lin et al. | 438/775 |
| 6,455,876 B1 * | 9/2002 | Kikawa et al. | 257/98 |
| 6,563,141 B1 * | 5/2003 | Dawson et al. | 257/98 |
| 6,737,801 B2 | 5/2004 | Ragle | |
| 6,746,889 B1 | 6/2004 | Eliashevich et al. | |
| 6,784,463 B2 | 8/2004 | Camras et al. | |
| 6,891,871 B1 * | 5/2005 | Nomura et al. | 372/45.01 |
| 7,087,936 B2 * | 8/2006 | Negley | 257/98 |
| 7,102,152 B2 | 9/2006 | Chua et al. | |
| 2007/0048953 A1 | 3/2007 | Gealy et al. | |
| 2007/0139923 A1 | 6/2007 | Negley et al. | |
| 2007/0170447 A1 | 7/2007 | Negley | |
| 2007/0236911 A1 | 10/2007 | Negley | |
| 2007/0263393 A1 | 11/2007 | Van De Ven | |
| 2007/0274063 A1 | 11/2007 | Negley | |
| 2007/0278512 A1 | 12/2007 | Loh et al. | |
| 2007/0280624 A1 | 12/2007 | Negley et al. | |

OTHER PUBLICATIONS

U.S. Appl. No. 11/895,573 (unpublished).
U.S. Appl. No. 11/818,818 (unpublished).
U.S. Appl. No. 12/002,429 (unpublished).

* cited by examiner

*Primary Examiner*—Victor A Mandala
(74) *Attorney, Agent, or Firm*—Vincent K. Gustafson; Intellectual Property/Technology Law

(57) ABSTRACT

An optoelectronic device includes a passivation layer of a dielectric material having a graded composition that varies with depth, whether continuous or stepwise, to provide a first index of refraction proximate to a semiconductor or conductor material and provide a second index of refraction adjacent to a surrounding material, such as an encapsulant. The resulting graded dielectric layer reduces Fresnel losses by reducing index of refraction mismatches between the adjacent semiconductor or conductor layer and the surrounding medium. Methods for forming graded dielectric layers include supplying a nitrogen-containing source gas at a declining flow rate or concentration, while supplying an oxygen-containing source gas an rising flow rate or concentration, to a deposition chamber.

67 Claims, 5 Drawing Sheets

FIG._2

Growth Conditions for Graded
Nitride-to-Oxide Dielectric Layer

FIG._4

GRADED DIELECTRIC LAYER

FIELD OF THE INVENTION

The present invention relates to optoelectronic device structures, including structures usable in light emitting diodes (LEDs) and devices employing same.

DESCRIPTION OF THE RELATED ART

A light emitting diode (LED) is an optoelectronic device including a semiconductor that emits incoherent narrow-spectrum light when electrically biased in the forward direction. This effect is a form of electroluminescence. A LED includes a semiconducting material doped with impurities to create a p-n junction. As in other diodes, current flows easily from the p-side (or anode), to the n-side (or cathode), but not in the reverse direction. Charge-carriers (i.e., electrons and electron holes) flow into the junction from electrodes with different voltages. When an electron meets a hole, it falls into a lower energy level, and releases energy in the form of a photon.

Referring to FIG. 1, a typical LED device 10 that employs a passivation layer includes one or more layers of semiconducting material 30 (comprising a first n-type or p-type semiconductor material portion 30A and a second n-type or p-type semiconductor material portion 30B) deposited over a substrate 20, an optional conductive material layer 35 disposed over the semiconducting material 30, a dielectric passivation layer 40 disposed over the semiconducting material 30 or conductive material layer 35, and an encapsulant 50, which can optionally acts as a lens or be accompanied by an additional lens (not shown). Typically, the dielectric passivation layer 40 is a uniform thin film (e.g., including an oxide or nitride material) for passivating the surface of the structure. Contacts (not shown) are typically provided in horizontal or vertical orientation, as would be recognized by one skilled in the art.

A common problem associated with LEDs is light loss due to internal reflections. There are two reasons for internal reflections. The first reason is the critical angle loss described by Snell's Law, which can produce total internal reflections (TIR). TIR arises as a result of the higher index of refraction of the semiconducting material relative to other materials in the path of the emitted light, such as a dielectric passivation layer, an encapsulant, and air. Typical group III semiconducting emitter materials having refractive indices between 2.4 and 2.6; passivation materials such as silicon nitride typically have refractive indices of around 2; encapsulant materials typically have refractive indices of around 1.5; and air has a refractive index of 1.0. At the interface between the semiconducting material (or optional conductive material) and the dielectric passivation material, and at the interface between each successive material, incident light traveling in an off-normal direction toward at the interface refracts as it passes through the interface, and the refracted light propagates into the lower index layer. If light strikes the interface at an angle sufficiently off-normal, it can be refracted to the point that it propagates in the plane of the interface, or—even worse—it can be reflected back into the high index semiconductor material. Such full reflection back into the source layer constitutes TIR.

The second reason for internal reflections is Fresnel loss. In the simplest example of Fresnel loss, a normally incident wave at the semiconductor surface, not refracted under Snell's law, is partially reflected based upon the difference in indices of refraction. The reflection loss in this case is computed as the square of $(n_{high}-n_{low})/(n_{high}+n_{low})$, where n is the refractive index of the higher or lower media. From this, a reflection loss of 4% is obtained as light travels at normal incidents through a glass-air interface. When $n_{high} \gg n_{low}$, Fresnel loss can approach TIR.

To enhance light output of LEDs, it would be beneficial to reduce light losses due to internal reflections.

SUMMARY OF THE INVENTION

The present invention relates in one aspect to an optoelectronic device comprising: a semiconductor material; a dielectric layer disposed over or adjacent to the semiconductor material; and a surrounding medium disposed adjacent to the dielectric layer; wherein the dielectric layer has a composition that varies with depth, providing an index of refraction that is graded from a higher value at a depth closer to the semiconductor material to a lower value at a depth closer to the surrounding medium.

In another aspect, the invention relates to an optoelectronic device comprising a dielectric layer having a thickness and disposed between a semiconductor material and a surrounding medium, wherein the dielectric layer is graded in composition along its thickness to provide a first index of refraction along a first boundary and provide a second index of refraction along a second boundary, with the second index of refraction being different from the first index of refraction.

In another aspect, the invention relates to a method for forming an optoelectronic device, the method comprising the steps of: ramping from high to low any of the flow rate and concentration of a first nitrogen-containing source gas supplied to a deposition chamber in production of a dielectric material; and ramping up from low to high any of the flow rate and composition of a second oxygen-containing source gas supplied to the deposition chamber in production of said dielectric material.

In a further aspect, any of the foregoing aspects may be combined for additional advantage.

Other aspects, features and embodiments of the invention will be more fully apparent from the ensuing disclosure and appended claims.

DETAILED DESCRIPTION OF THE INVENTION, AND PREFERRED EMBODIMENTS THEREOF

The present invention relates to optoelectronic devices having dielectric passivation layers that are compositionally graded relative to depth, resulting in a first index of refraction along one surface and a second index of refraction along the other surface. Such graded dielectric enables reduction of Fresnel losses by reducing index of refraction mismatches (1) between a semiconductor layer (or optional conductor layer deposited thereon) and the dielectric layer, and (2) between the dielectric layer and a surrounding medium, such as an encapsulant and/or air. As emitted light travels through such a dielectric layer, the light will refract or bend and thereby result in a wider emission angle (with such off-axis light subject to being redirected with a reflector or other optical aid), but if the indices of refraction are approximately matched at the material interfaces along the top and bottom of the dielectric layer, then TIR will be substantially eliminated. The index of refraction of one surface of the dielectric layer is preferably matched to the underlying layer (e.g., semiconductor or conductor), and the index of refraction of the other surface of the dielectric layer is preferably matched to the overlying surrounding medium, such as an encapsulant or air.

In one embodiment, the composition of a dielectric passivation layer varies from (1) a high nitride, low oxide concentration adjacent to a semiconductor layer, to (2) a high oxide, low nitride concentration adjacent to a surrounding medium, with a graded oxynitride material disposed therebetween.

If the outermost portion of a semiconductor layer is a p-type semiconductor material (e.g., p-type GaN), and if it is desired to improve conductivity of such p-type layer (i.e., to enable lateral current flow from a bonding pad to all parts of the p-n junction), then a conductive layer may be deposited on the surface of the p-type semiconductor for such purpose. Such conductive layer may comprise a thin (e.g., <100 Angstrom thickness) semi-transparent metal such as platinum, gold, nickel, or combinations thereof. Alternatively, a transparent conductive oxide layer may be used (e.g., indium tin oxide or tin oxide). If a conductive layer is used in conjunction with a graded dielectric layer according to the present invention, the graded dielectric layer may be graded in index of refraction from about the index of the conductive layer to about the index of refraction of the surrounding medium (e.g., encapsulant or air).

Figure 1:
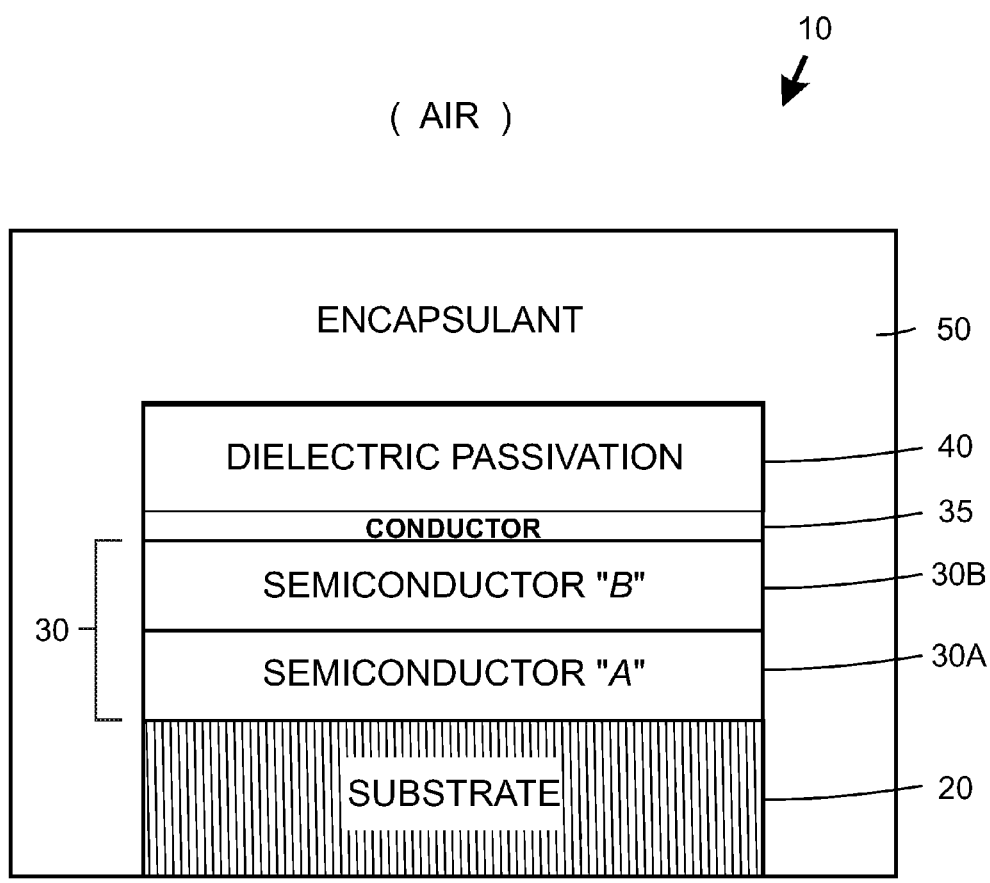
FIG. 1 is a schematic cross-sectional illustration of a conventional LED device having a passivation layer disposed between a light-emitting semiconductor material layer and an encapsulant.
Figure 2:
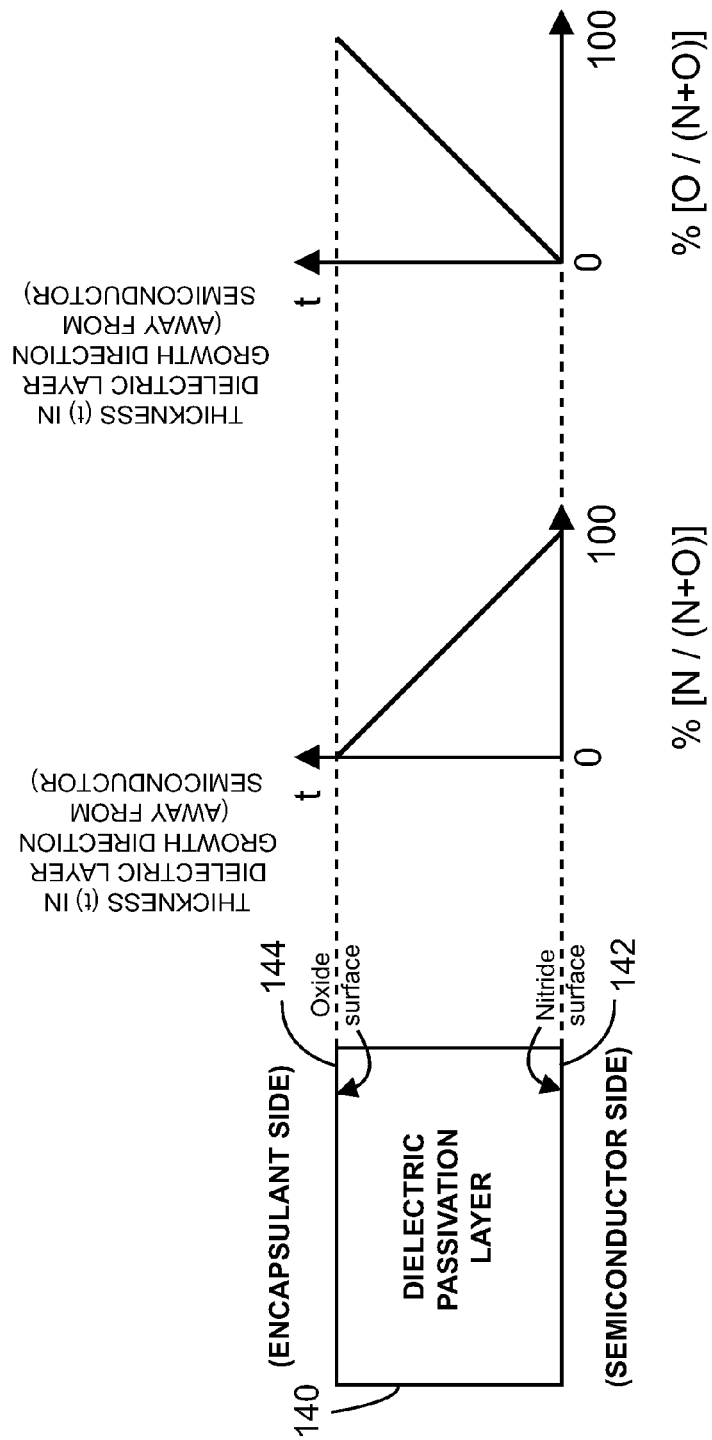
FIG. 2 is a composite diagram illustrating (i) at left, a cross-sectional view of a graded dielectric passivation layer according to one embodiment of the present invention with the dielectric passivation layer having a nitride surface adjacent an underlying (e.g., semiconductor or conductor) material layer and having an oxide surface adjacent an encapsulant material; (ii) at center, a chart depicting nitride content relative to thickness of the dielectric passivation material; and (iii) at right, a chart depicting oxide content relative to thickness of the dielectric passivation material.

An example of such a dielectric passivation layer 140 is illustrated in FIG. 2. The dielectric layer 140 includes a first surface 142 having a high nitride concentration, and includes a second surface 144 having a high oxide concentration. Between the first surface 142 and the second surface 144, the dielectric layer 140 preferably has a composition containing both oxide and nitride in progressively varying concentrations, as illustrated in the center and rightmost frames of FIG. 2. The center frame of FIG. 2 depicts nitride content relative to thickness of the dielectric passivation material 140, while the rightmost frame of FIG. 2 depicts oxide content relative to thickness of the dielectric passivation material 140. In one embodiment, Such nitride and oxide materials may include silicon nitride ($Si_3N_4$) and silicon dioxide ($SiO_2$) at the outer margins (e.g., bottom and top surfaces, respectively), with an intermediate oxynitride, such as silicon oxynitride ($Si_xO_yN_z$), in between. While FIG. 2 illustrates a linear variation of oxide and nitride concentration relative to dielectric material thickness, it is to be understood that such variation may be curvilinear or otherwise non-linear.

A graded dielectric layer should desirably be free of abrupt changes in refractive index relative to depth in order to minimize the possibility of total internal reflections due to Fresnel loss. The preceding dielectric layer 140 having a continuous gradation in composition represents one embodiment of such a graded dielectric layer.

Figure 5:
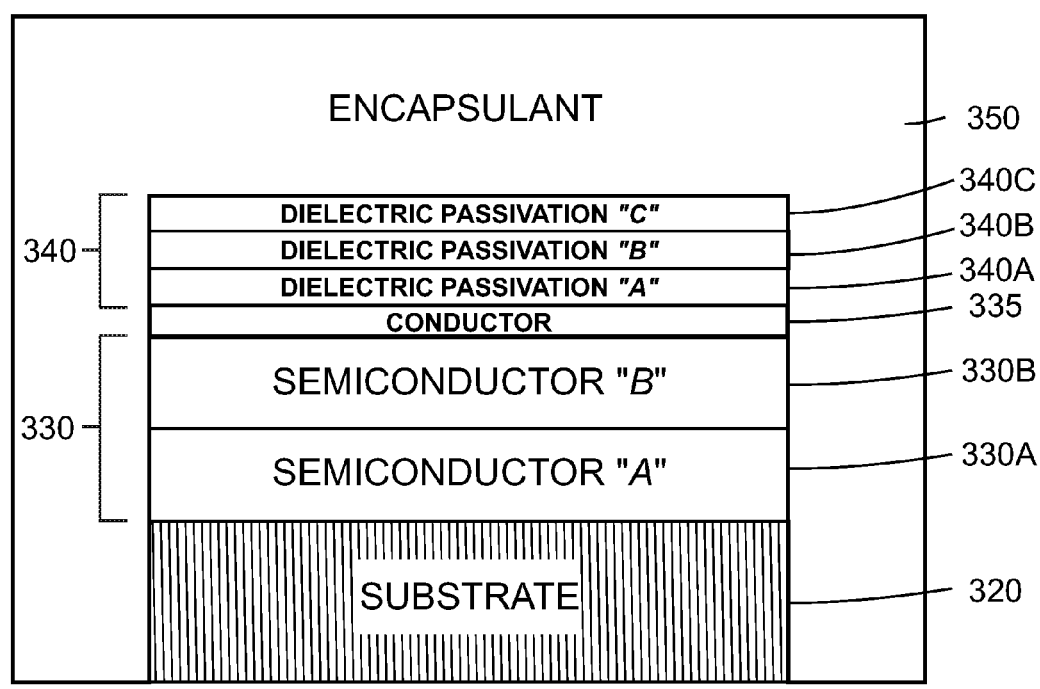
FIG. 5 is a schematic cross-sectional illustration of a LED device having a passivation layer comprising multiple sublayers disposed between a light-emitting semiconductor material layer and an encapsulant.

In another embodiment, a graded dielectric layer may include a plurality of discrete dielectric sublayers having different indices of refraction that vary from one sublayer to the next. One example of such an embodiment is illustrated in FIG. 5, which illustrates an LED device 310 including one or more layers of semiconductor material 330 (e.g., comprising a first n-type or p-type semiconductor material portion 330A and a second n-type or p-type semiconductor material portion 330B) deposited over a substrate 320, an optional conductive material layer 335 disposed over the semiconductor material 330, a dielectric material 340 disposed over the semiconductor material 330 and optional conductive material 335, and an encapsulate 350. In the illustrated embodiment, the dielectric material 340 includes three sublayers 340A-340C, with the composition of each sublayer 340A-340C being substantially constant, but with each sublayer 340A-340C have an index of refraction that differs from the other sublayers 340A-340C. Preferably, the first sublayer 340A has an index of refraction that is closer to the index of refraction of the underlying layer (e.g., semiconductor 330 or optional conductor 335), the third sublayer has an index of refraction that is closer to the index of refraction of the surrounding material (e.g., encapsulant 350 or air), and the second sublayer 340B has an index of refraction that is intermediate to the indices of refraction of the first and second sublayers 340A, 340C. Any desirable number of discrete dielectric sublayers may be provided in such an embodiment to form a composite graded dielectric layer 340. In the aggregate, such dielectric sublayers may be termed to have a composition that varies stepwise through the thickness of a composite graded dielectric layer.

In one embodiment, a graded dielectric layer includes both stepwise and continuously graded portions.

Graded dielectric layers as described herein may be deposited over any suitable Group III-arsenide, -phosphide, and/or -nitride semiconducting emitter material. Such material typically has an index of refraction in a range of between about 2.4 and about 2.6.

The composition of a particular dielectric layer may be selected based on the indices of refraction of the underlying material and the surrounding material. In one embodiment, a graded dielectric layer comprises an oxynitride (e.g., silicon oxynitride), with an oxynitride composition that varies, either continuously or stepwise, with depth. In various other embodiments, a graded dielectric layers includes oxide and oxynitride portions, and/or nitride and oxynitride portions.

Dielectric layers are commonly formed by deposition processes such as plasma-enhanced vapor deposition (PEVCD) and reactive sputtering. Graded dielectric layers as described herein may have various thicknesses within the capabilities of the foregoing deposition processes. In one embodiment, a graded dielectric layer has a thickness of less than about 2 microns. In another embodiment, a graded dielectric layer has a thickness of between about 0.5 and 1 micron. In still another embodiment, a graded dielectric layer has a thickness of less than about 0.5 micron.

Figure 3:
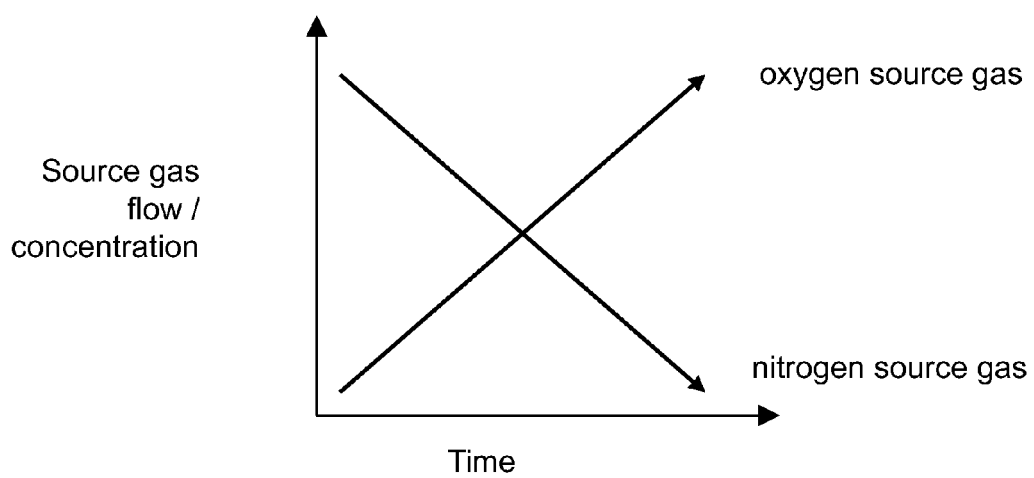
FIG. 3 is a simplified line graph illustrating flow and/or concentration of oxygen and nitrogen source gases relative to time, as applied to grow a dielectric passivation layer according to one embodiment of the present invention, the dielectric layer having a graded composition that varies with thickness from a nitride to an oxide.

A process for generating a dielectric passivation layer having a graded composition relative to its thickness preferably includes supplying to a process (e.g., deposition) chamber a nitrogen-containing source gas at an initially high flow rate and/or concentration that declines with time, and preferably includes supplying an oxygen-containing source gas at an initially low flow rate and/or concentration that rises with time. A simplified line graph illustrating these steps is provided in FIG. 3. A nitrogen source gas, such as ammonia, is supplied to a process chamber at an initially high concentration and/or flow rate that declines over time. An oxygen source gas, such as diatomic oxygen or nitrous oxide, is supplied to a process chamber at an initially low concentration and/or flow rate that rises over time. While linear slopes for oxygen and nitrogen source flow are depicted, a desirable grading profile may require nonlinear and/or stepped profiles for the supply of such components. It is further noted that linear changes in oxygen and/or nitrogen source supply flow do not necessarily result in linear changes in index of refraction of a graded dielectric layer produced thereby. Variation in nitrogen source flow and/or concentration variation is preferably altered substantially simultaneously as variation in oxygen source flow and/or concentration. Sources of additional gases are preferably provided to supply atoms of additional elements (e.g., silicon) to the dielectric layer. As atoms from the various source gases are supplied to the process chamber, they are deposited by any conventional deposition process to form the dielectric layer. Controlled variation in the supply of oxygen and nitrogen generates a dielectric layer that preferably varies from high nitride and low oxide concentration adjacent to the semiconductive emitter material, to low nitride and high oxide concentration adjacent to the surrounding medium. Flow and/or concentration may be varied according to any desirable profile to generate the desired compositional variation relative to thickness in the dielectric passivation layer.

Preferred deposition processes for forming graded dielectric layers may depend on the material system of the adjacent semiconducting emitter. PECVD systems that employ ammonia (NH3) as the nitrogen source also introduce hydrogen to the plasma, therefore, reactive sputtering may be preferred for use with nitride emitter materials. In contrast, phosphide and arsenide emitter materials are less detrimentally affected by hydrogen exposure, so PECVD may be more suitable for use with phosphide and arsenide emitter materials in practice of the present invention to yield a graded dielectric layer.

Figure 4:
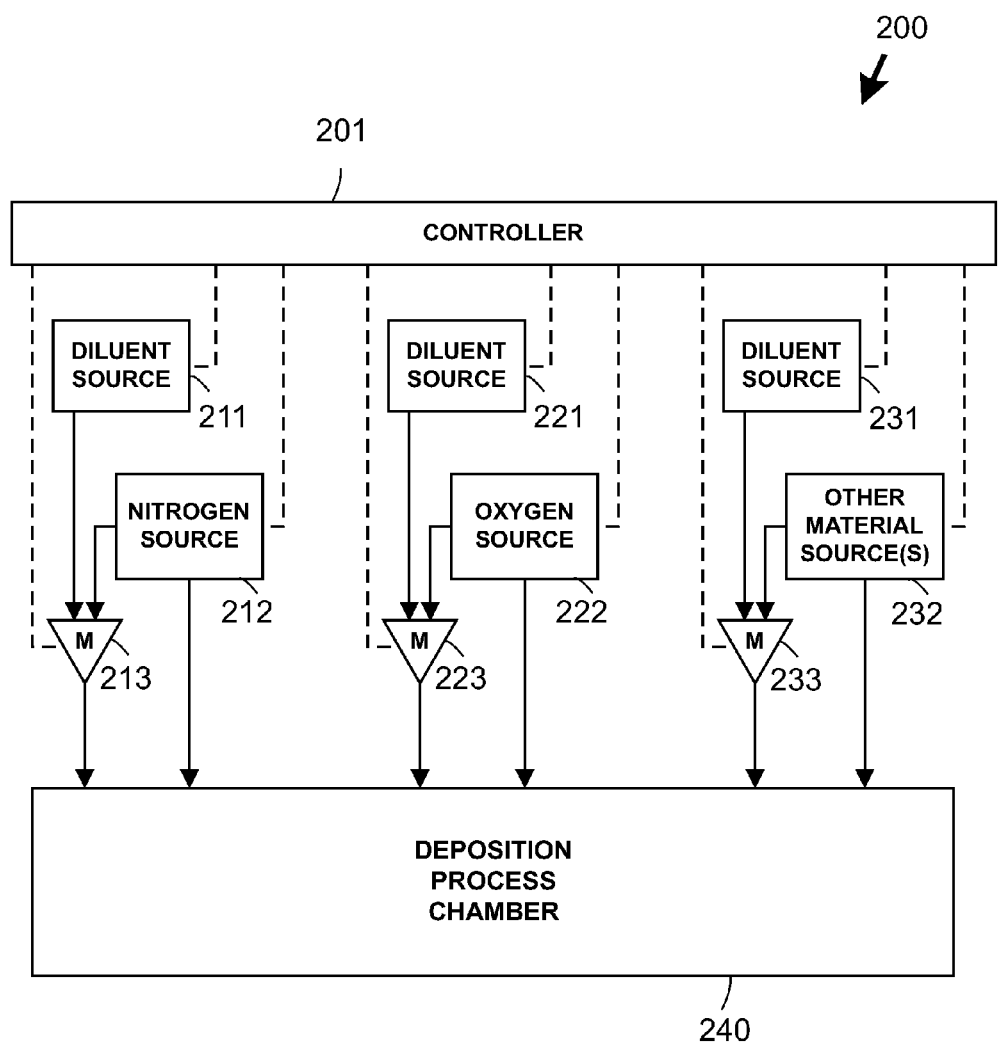
FIG. 4 is a schematic illustrating interconnects between various components of a process control system adapted to generate a graded-composition dielectric passivation layer according to one embodiment of the present invention.

A process control system 200 adapted to generate a graded-composition dielectric passivation layer is illustrated schematically in FIG. 4. A deposition process chamber 240 is in at least intermittent fluid communication with a nitrogen source 212, an oxygen source 222, and at least one other material source 232, with each source 212, 222, 232 preferably provided in gaseous form and preferably having an associated flow control device (not shown), such as a control valve, to enable flow regulation. Flow rate from each source 212, 222, 232 may be controlled by a central controller 201. If it is alternatively or additionally desired to control the concentration of nitrogen, oxygen, or other material, sources of diluent (e.g., noble gases such as helium, argon, or xenon) 211, 221, 231 and mixers 213, 223, 233, each controllable by the controller 201, may be employed. By adjusting the relative flows of diluent and oxygen or nitrogen or other material(s) through each mixer 213, 223, 233, concentration of each of oxygen, nitrogen, and other material(s) supplied to the process chamber 240 may be adjusted thereby with respect to time, in order to achieve a dielectric layer having a composition that varies with respect to depth of said layer (or distance relative to an underlying semiconductor or conductor material over which the dielectric layer is applied). Such variation in composition may be continuous and/or stepped relative to the thickness of the dielectric layer. The same process chamber 240 may have been used to grow a semiconducting emitter layer over which the graded-composition dielectric layer is deposited.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. An optoelectronic device comprising:
   a semiconductor material having a face and at least one edge, wherein the semiconductor material is adapted to emit light from the face;
   a dielectric layer disposed over substantially the entire face of the semiconductor material; and
   a surrounding medium disposed adjacent to the dielectric layer;
   wherein the dielectric layer has a composition that varies with depth, providing an index of refraction that is graded from a first value at a depth closer to the semiconductor material to a second value at a depth closer to the surrounding medium, and the second value is different from the first value;
   wherein the dielectric layer is adapted to reduce internal reflection of light emitted from the face of the semiconductor material, and
   wherein the dielectric layer is further characterized by at least one of the following features (a) to (d);
   (a) the dielectric layer comprises a nitride material portion, an oxide material portion, and an oxynitride material portion disposed between the nitride material portion and the oxide material portion, wherein the oxide material portion is disposed proximate to the surrounding medium;
   (b) the dielectric layer comprises an oxide material portion and an oxynitride material portion;
   (c) the dielectric layer comprises a nitride material portion and an oxynitride material portion; and
   (d) the dielectric layer comprises a plurality of discrete sublayers, with each sublayer of the plurality of sublayers having a substantially constant composition that is different from the composition of the other sublayers of the plurality of sublayers.

2. The optoelectronic device of claim 1, wherein the first value is higher than the second value.

3. The optoelectronic device of claim 1, comprising a light emitting diode.

4. The optoelectronic device of claim 1, wherein the surrounding medium comprises an encapsulant material.

5. The optoelectronic device of claim 1, wherein the surrounding medium comprises air.

6. The optoelectronic device of claim 1, wherein at least the face of the semiconductor material has a first index of refraction, the surrounding medium has a second index of refraction, and the dielectric material has an index of refraction that is graded from about the first index of refraction proximate to the face of semiconductor material to about the second index of refraction proximate to the surrounding medium.

7. The optoelectronic device of claim 1, further comprising a conductive material layer disposed between the semiconductor material and the dielectric layer.

8. The optoelectronic device of claim 7, wherein the conductive material layer comprises a semi-transparent metal layer.

9. The optoelectronic device of claim 7, wherein the conductive material layer comprises a transparent conductive oxide layer.

10. The optoelectronic device of claim 7, wherein the conductive material has a third index of refraction, the surrounding medium has a second index of refraction, and the dielectric material has an index of refraction that is graded from about the third index of refraction proximate to the conductive material to about the second index of refraction proximate to the surrounding medium.

11. The optoelectronic device of claim 1, wherein the semiconductor material comprises any of a group III-arsenide, -phosphide, and -nitride material.

12. The optoelectronic device of claim 1, wherein the semiconductor material comprises a group III-nitride material.

13. The optoelectronic device of claim 1, wherein the dielectric layer comprises a nitride material portion, an oxide material portion, and an oxynitride material portion disposed between the nitride material portion and the oxide material portion, wherein the oxide material portion is disposed proximate to the surrounding medium.

14. The optoelectronic device of claim 13, wherein the nitride material portion is deposited directly on the semiconductor material.

15. The optoelectronic device of claim 13, wherein the nitride material portion is deposited directly on a conductive material overlying the semiconductor material.

16. The optoelectronic device of claim 13, wherein the nitride material comprises silicon nitride, the oxide material comprises silicon dioxide, and the oxynitride material comprises silicon oxynitride.

17. The optoelectronic device of claim 13, wherein the nitride material has a refractive index of about 2.5, and the surrounding medium has a refractive index in a range of about 1 to about 1.5.

18. The optoelectronic device of claim 1, wherein the dielectric layer comprises an oxynitride material portion having a composition that varies with depth.

19. The optoelectronic device of claim 1, wherein the dielectric layer comprises an oxide material portion and an oxynitride material portion.

20. The optoelectronic device of claim 1, wherein the dielectric layer comprises a nitride material portion and an oxynitride material portion.

21. The optoelectronic device of claim 1, wherein the dielectric layer comprises a plurality of discrete sublayers, with each sublayer of the plurality of sublayers having a substantially constant composition that is different from the composition of the other sublayers of the plurality of sublayers.

22. The optoelectronic device of claim 1, wherein the dielectric layer composition varies substantially continuously with depth.

23. The optoelectronic device of claim 1, wherein the dielectric layer composition varies stepwise with depth.

24. An optoelectronic device comprising a dielectric layer having a thickness and disposed between a semiconductor material and a surrounding medium, wherein the semiconductor material has a face, has at least one edge, and is adapted to emit light from the face; the dielectric layer is disposed over substantially the entire face of the semiconductor material, wherein the dielectric layer is graded in composition along its thickness to provide a first index of refraction along a first boundary and provide a second index of refraction along a second boundary, with the second index of refraction being different from the first index of refraction, and wherein the dielectric layer is adapted to reduce internal reflection of light emitted from the face of the semiconductor material, and wherein the dielectric layer is further characterized by at least one of the following features (a) to (d);

(a) the dielectric layer comprises a nitride material portion, an oxide material portion, and an oxynitride material portion disposed between the nitride material portion and the oxide material portion, wherein the oxide material portion is disposed proximate to the surrounding medium;

(b) the dielectric layer comprises an oxide material portion and an oxynitride material portion;

(c) the dielectric layer comprises a nitride material portion and an oxynitride material portion; and (d) the dielectric layer comprises a plurality of discrete sublayers, with each sublayer of the plurality of sublayers having a substantially constant composition that is different from the composition of the other sublayers of the plurality of sublayers.

25. The optoelectronic device of claim 24, wherein the first index of refraction is greater than the second index of refraction.

26. The optoelectronic device of claim 24, wherein the first boundary is adjacent to the semiconductor material, and the second boundary is adjacent to the surrounding medium.

27. The optoelectronic device of claim 26, wherein at least a portion of the semiconductor material has an index of refraction about the same as the first index of refraction, and at least a portion of the surrounding medium has an index of refraction about the same as the second index of refraction.

28. The optoelectronic device of claim 24, comprising a light emitting diode.

29. The optoelectronic device of claim 24, wherein the surrounding medium comprises an encapsulant material.

30. The optoelectronic device of claim 24, wherein the surrounding medium comprises air.

31. The optoelectronic device of claim 24, further comprising a conductive material layer disposed between the semiconductor material and the dielectric layer.

32. The optoelectronic device of claim 31, wherein the conductive material layer comprises a semi-transparent metal layer.

33. The optoelectronic device of claim 31, wherein the conductive material layer comprises a transparent conductive oxide layer.

34. The optoelectronic device of claim 31, wherein the first boundary is adjacent to the conductive material, and the second boundary is adjacent to the surrounding medium.

35. The optoelectronic device of claim 34, wherein at least a portion of the conductive material has an index of refraction about the same as the first index of refraction, and at least a portion of the surrounding medium has an index of refraction about the same as the second index of refraction.

36. The optoelectronic device of claim 24, wherein the semiconductor material comprises any of a group-III arsenide, phosphide, and nitride material.

37. The optoelectronic device of claim 24, wherein the semiconductor material comprises a III-nitride material.

38. The optoelectronic device of claim 24, wherein the dielectric layer comprises a nitride material portion, an oxide material portion, and an oxynitride material portion disposed between the nitride material portion and the oxide material portion, wherein the oxide material portion is disposed proximate to the surrounding medium.

39. The optoelectronic device of claim 38, wherein the nitride material portion is deposited directly on the semiconductor material.

40. The optoelectronic device of claim 38, wherein the nitride material portion is deposited directly on a conductive material overlying the semiconductor material.

41. The optoelectronic device of claim 38, wherein the nitride material comprises silicon nitride, the oxide material comprises silicon dioxide, and the oxynitride material comprises silicon oxynitride.

42. The optoelectronic device of claim 38, wherein the nitride material has a refractive index of about 2.5, and the surrounding medium has a refractive index in a range of about 1 to about 1.5.

43. The optoelectronic device of claim 24, wherein the dielectric layer comprises an oxynitride material having a composition that varies with depth.

44. The optoelectronic device of claim 24, wherein the dielectric layer comprises an oxide material portion and an oxynitride material portion.

45. The optoelectronic device of claim 24, wherein the dielectric layer comprises a nitride material portion and an oxynitride material portion.

46. The optoelectronic device of claim 24, wherein the dielectric layer comprises a plurality of discrete sublayers, with each sublayer of the plurality of sublayers having a substantially constant composition that is different from the composition of the other sublayers of the plurality of sublayers.

47. The optoelectronic device of claim 24, wherein the dielectric layer composition varies substantially continuously with depth.

48. The optoelectronic device of claim 24, wherein the dielectric layer composition varies stepwise with depth.

49. A method for forming an optoelectronic device including (1) a semiconductor material having a face and at least one edge, wherein the semiconductor material is adapted to emit light from the face, (2) a dielectric layer disposed over substantially the entire face of the semiconductor material, and (3) a surrounding medium disposed adjacent to the dielectric layer, wherein the dielectric layer has a composition that varies with depth, providing an index of refraction that is graded from a first value at a depth closer to the semiconductor material to a second value at a depth closer to the surrounding medium, and the second value is different from the first value; wherein the dielectric layer is adapted to reduce internal reflection of light emitted from the face of the semiconductor material, and wherein the dielectric layer is further characterized by at least one of the following features (a) to (d); (a) the dielectric layer comprises a nitride material portion, an oxide material portion, and an oxynitride material portion disposed between the nitride material portion and the oxide material portion, wherein the oxide material portion is disposed proximate to the surrounding medium; (b) the dielectric layer comprises an oxide material portion and an oxynitride material portion; (c) the dielectric layer comprises a nitride material portion and an oxynitride material portion; and (d) the dielectric layer comprises a plurality of discrete sublayers, with each sublayer of the plurality of sublayers having a substantially constant composition that is different from the composition of the other sublayers of the plurality of sublayers; the method comprising the steps of:

ramping from high to low any of the flow rate and concentration of a first nitrogen-containing source gas supplied to a deposition chamber in production of the dielectric material; and ramping from low to high any of the flow rate and composition of a second oxygen-containing source gas supplied to the deposition chamber in production of the dielectric material.

50. The method of claim 49, wherein the nitrogen-containing source gas ramping step is performed substantially simultaneously with the oxygen-containing source gas ramping step.

51. The method of claim 49, further comprising depositing $Si_3N_4$ material over the semiconductor material.

52. The method of claim 51 wherein the semiconductor material comprises any of a group-III arsenide, phosphide, and nitride emitter.

53. The method of claim 51, further comprising depositing a conductor between the semiconductor material and the $Si_3N_4$ material.

54. The method of claim 51, further comprising depositing $SiO_2$ material above said $Si_3N_4$ material.

55. The method of claim 54, further comprising depositing $Si_xO_yN$ material between said $Si_3N_4$ material and said SiO2 material.

56. The method of claim 49, wherein the nitrogen-containing source gas is ramped from high to low flow rate, and the oxygen-containing source gas is ramped from low to high flow rate.

57. The method of claim 49, wherein nitrogen atoms from the nitrogen-containing source gas and oxygen atoms from the oxygen-containing source gas are deposited on or over the semiconductor material in a plasma-enhanced chemical vapor deposition process.

58. The method of claim 49, wherein nitrogen atoms from the nitrogen-containing source gas and oxygen atoms from the oxygen-containing source gas are deposited on or over the semiconductor material in a reactive sputtering process.

59. The method of claim 49, wherein any of the nitrogen-containing source gas and the oxygen-containing source gas comprises a noble gas.

60. The method of claim 49, wherein the nitrogen-containing source gas comprises ammonia.

61. The method of claim 49, wherein the oxygen-containing source gas comprises any of diatomic oxygen and nitrous oxide.

62. The method of claim 49, further comprising forming a dielectric passivation layer having a composition that varies substantially continuously with depth.

63. The method of claim 49, further comprising forming a dielectric passivation layer having a composition that varies stepwise with depth.

64. The method of claim 49, further comprising forming a dielectric layer comprising an oxynitride material having a composition that various with depth.

65. The method of claim 49, further comprising forming a dielectric layer comprising an oxide material portion and an oxynitride material portion.

66. The method of claim 49, further comprising forming a dielectric layer comprising a nitride material portion and an oxynitride material portion.

67. An optoelectronic device comprising:
a semiconductor material;
a dielectric layer disposed over the semiconductor material; and
an encapsulant material disposed over the dielectric layer, the encapsulant material having an index of refraction;

wherein the dielectric layer has a composition that is graded along its thickness to provide a first index of refraction along a first boundary proximate to the semiconductor material and to provide a second index of refraction along a second boundary proximate to the encapsulant material, wherein the second index of refraction of the dielectric layer is substantially matched to the index of refraction of the encapsulant material; and (a) the dielectric layer comprises a nitride material portion, an oxide material portion, and an oxynitride material portion disposed between the nitride material portion and the oxide material portion, wherein the oxide material portion is disposed proximate to the surrounding medium;

(b) the dielectric layer comprises an oxide material portion and an oxynitride material portion;

(c) the dielectric layer comprises a nitride material portion and an oxynitride material portion; and (d) the dielectric layer comprises a plurality of discrete sublayers, with each sublayer of the plurality of sublayers having a substantially constant composition that is different from the composition of the other sublayers of the plurality of sublayer.

* * * * *

UNITED STATES PATENT AND TRADEMARK OFFICE
CERTIFICATE OF CORRECTION

PATENT NO. : 7,638,811 B2 Page 1 of 1
APPLICATION NO. : 11/685761
DATED : December 29, 2009
INVENTOR(S) : David B. Slater, Jr.

It is certified that error appears in the above-identified patent and that said Letters Patent is hereby corrected as shown below:

Column 8, line 7 (claim 24): "refraction, and wherein" should be -- refraction, wherein --.

Column 10, line 24 (claim 55): "SiO2" should be -- $SiO_2$ --.

Signed and Sealed this

Sixth Day of April, 2010

David J. Kappos
*Director of the United States Patent and Trademark Office*